(12) United States Patent
Li

(10) Patent No.: US 11,375,631 B2
(45) Date of Patent: Jun. 28, 2022

(54) MOBILE TERMINAL

(71) Applicant: VIVO MOBILE COMMUNICATION CO., LTD., Guangdong (CN)

(72) Inventor: Manlin Li, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 0 days.

(21) Appl. No.: 17/332,910

(22) Filed: May 27, 2021

(65) Prior Publication Data
US 2021/0289647 A1    Sep. 16, 2021

Related U.S. Application Data

(63) Continuation of application No. PCT/CN2019/117437, filed on Nov. 12, 2019.

(30) Foreign Application Priority Data

Dec. 5, 2018  (CN) .......................... 201811482012.7

(51) Int. Cl.
*G06F 1/16*    (2006.01)
*H05K 5/00*    (2006.01)
(Continued)

(52) U.S. Cl.
CPC ......... *H05K 5/0295* (2013.01); *H05K 5/0291* (2013.01)

(58) Field of Classification Search
CPC .. H05K 5/0295; H05K 5/0291; H05K 5/0286; H05K 5/0256; H05K 5/026; H05K 5/0265; H05K 5/0269; H05K 5/0282
See application file for complete search history.

(56) References Cited

U.S. PATENT DOCUMENTS 6,669,493 B2 * 12/2003 Kuroda ................ H01R 13/629
                                                                439/159
7,534,116 B2 *  5/2009 Ho ......................... G06K 13/08
                                                                439/159
(Continued)

FOREIGN PATENT DOCUMENTS

CN        103915699 A      7/2014
CN        204011822 U     12/2014
(Continued)

OTHER PUBLICATIONS

CN Office Action in Application No. 201811482012.7 dated Nov. 11, 2019.
(Continued)

*Primary Examiner* — Anthony M Haughton
(74) *Attorney, Agent, or Firm* — Maschoff Brennan

(57) ABSTRACT

A mobile terminal is provided, which includes: a housing, having a tray installation hole; a circuit board, disposed inside the housing; a tray retention portion, disposed inside the housing, where the tray retention portion faces toward the circuit board; a card holder, disposed on the circuit board; a tray, movably disposed in the tray installation hole and movably mating with the tray retention portion, at least the tray or the housing is provided with an ejection hole; and a toggle piece, rotatably disposed at the tray retention portion and located between the card holder and the ejection hole, one end of the toggle piece is an ejector pin action receiving end, the other end of the toggle piece is a tray ejection end, and the tray ejection end is used to apply an ejection force to the tray after a force is applied to the ejector pin action receiving end.

12 Claims, 5 Drawing Sheets

(51) Int. Cl.
*H05K 7/00* (2006.01)
*H05K 5/02* (2006.01)

(56) References Cited

U.S. PATENT DOCUMENTS

| | | | | |
|---|---|---|---|---|
| 7,632,117 | B1* | 12/2009 | Van der Steen | H01R 13/635 439/159 |
| 7,811,106 | B2* | 10/2010 | Lin | G06K 13/0806 439/159 |
| 8,944,833 | B2* | 2/2015 | Takahashi | H05K 5/0295 439/159 |
| 9,703,333 | B1* | 7/2017 | Harting | G11B 15/675 |
| 9,772,662 | B1* | 9/2017 | Harting | G06F 1/187 |
| 2009/0267677 | A1 | 10/2009 | Myers et al. | |
| 2013/0260583 | A1 | 10/2013 | Takahashi et al. | |
| 2014/0101466 | A1 | 4/2014 | Itakura | |
| 2015/0249306 | A1 | 9/2015 | Han et al. | |
| 2017/0093057 | A1 | 3/2017 | Wang et al. | |

FOREIGN PATENT DOCUMENTS

| | | |
|---|---|---|
| CN | 204011895 U | 12/2014 |
| CN | 104300305 A | 1/2015 |
| CN | 204205181 U | 3/2015 |
| CN | 106200819 A | 12/2016 |
| CN | 206135892 U | 4/2017 |
| CN | 106790776 A | 5/2017 |
| CN | 107257246 A | 10/2017 |
| CN | 104300305 B | 8/2018 |
| CN | 207732122 U | 8/2018 |
| CN | 109638496 A | 4/2019 |

OTHER PUBLICATIONS

Written Opinion and International Search Report in Application No. PCT/CN2019/117437 dated Jun. 17, 2021.
EP Search Report in Application No. 19893422.6 dated Jan. 17, 2022.
Japanese Office Action issued in corresponding application No. 2021-530227, dated May 9, 2022.

* cited by examiner

MOBILE TERMINAL

CROSS-REFERENCE TO RELATED APPLICATIONS

This application is a continuation application of PCT Application No. PCT/CN2019/117437 filed on Nov. 12, 2019, which claims priority to Chinese Patent Application No. 201811482012.7, filed in China on Dec. 5, 2018, disclosures of which are incorporated herein by reference in their entireties.

TECHNICAL FIELD

This disclosure relates to the field of communications device technologies, and in particular, to a mobile terminal.

BACKGROUND

Subscriber identification modules (SIM) and memory cards are common cards used in mobile terminals. As mobile terminals are increasingly compact in structure, more and more mobile terminals are having their SIM cards and memory cards installed in a tray.

To facilitate ejection and insertion of a tray, an ejection apparatus is correspondingly provided in a mobile terminal. The ejection apparatus includes a push rod and a toggle piece. When the tray is installed inside the mobile terminal, the toggle piece is located at the end of the tray, the push rod is located on a side of the tray, and one end of the push rod can be in contact with one end of the toggle piece. When the tray needs to be ejected, a user can insert an ejector pin into an ejection hole opened in a housing of the mobile terminal, so that the ejector pin can directly act on the push rod, and the ejector pin drives the push rod to move and finally drives the toggle piece to rotate, thereby applying an ejection force to the tray to eject the tray.

However, both the push rod and the toggle piece of the ejection apparatus occupy partial space of a circuit board, causing the core region of the circuit board to be divided, make a region of the circuit board that can be used for arranging electronic components smaller, and hindering electronic component layout on the circuit board.

SUMMARY

A mobile terminal is provided, including:

a housing, provided with a tray installation hole;

a circuit board, disposed inside the housing;

a tray retention portion, disposed inside the housing, where the tray retention portion faces toward the circuit board;

a card holder, disposed on the circuit board;

a tray, movably disposed in the tray installation hole and movably mating with the tray retention portion, where at least the tray or the housing is provided with an ejection hole; and a toggle piece, rotatably disposed at the tray retention portion and located between the card holder and the ejection hole, where one end of the toggle piece is an ejector pin action receiving end, the other end of the toggle piece is a tray ejection end, and the tray ejection end is used to apply an ejection force to the tray after a force is applied to the ejector pin action receiving end.

BRIEF DESCRIPTION OF DRAWINGS

The drawings described herein are used to provide a further understanding about this disclosure, and constitute a part of this disclosure. Exemplary embodiments of this disclosure and descriptions thereof are used to explain this disclosure, but do not constitute any inappropriate limitation on this disclosure. In the drawings.

Reference signs in the accompanying drawings are described as follows:

100. housing; 110. tray installation hole; 120. ejection hole; 200. circuit board; 210. avoidance notch; 300. card holder; 310. first SIM card holder; 320. second SIM card holder; 330. memory card holder; 400. tray; 410. first SIM card; 420. second SIM card; 430. memory card; 440. memory card support portion; 500. toggle piece; 510. ejector pin action receiving end; 511. ejector pin action receiving slot; 520. tray ejection end; 521. ejection protrusion; 600. rivet; 700. ejector pin; 800. tray retention portion; 910. elastic detection piece; 911. free end; 912. tray action receiving portion; 920. detection terminal; and 930. terminal fastener.

DESCRIPTION OF EMBODIMENTS

To make the objectives, technical solutions, and advantages of this disclosure clearer, the following clearly describes the technical solutions of this disclosure with reference to specific embodiments of this disclosure and corresponding drawings. Apparently, the described embodiments are merely a part rather than all of the embodiments of this disclosure. All other embodiments that a person of ordinary skill in the art obtains without creative efforts based on the embodiments of this disclosure shall fall within the protection scope of this disclosure.

The technical solutions disclosed in the embodiments of this disclosure are described in detail below with reference to the accompanying drawings.

Figure 1:
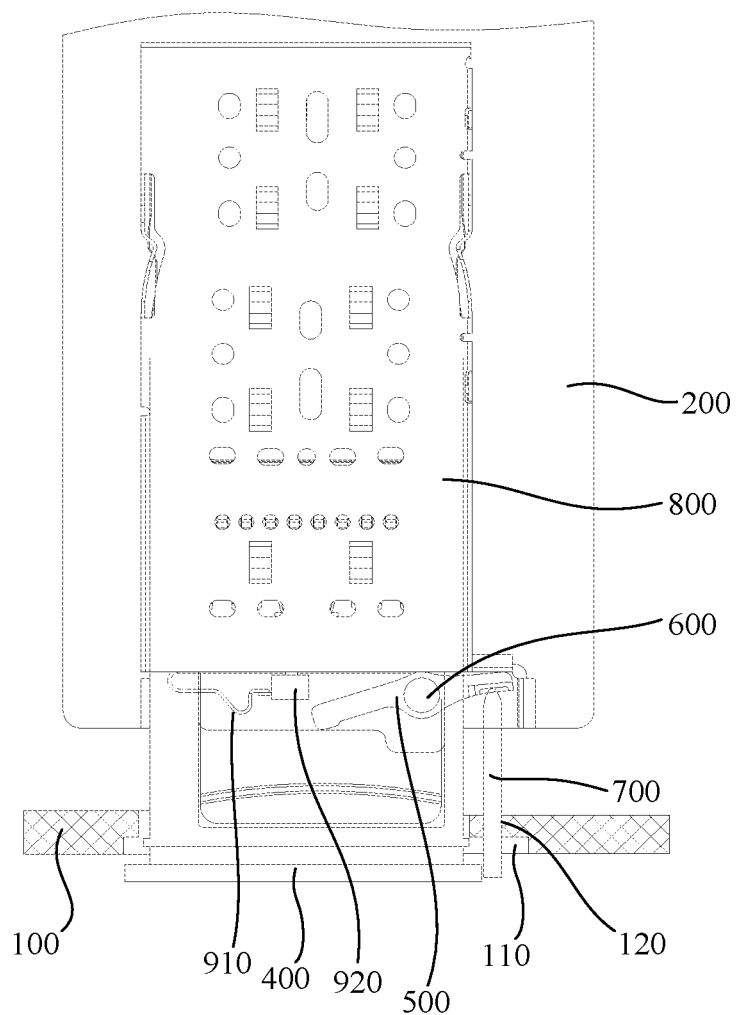
FIG. 1 is a schematic diagram of a partial structure of a mobile terminal when a tray is ejected according to an embodiment of this disclosure.
Figure 2:
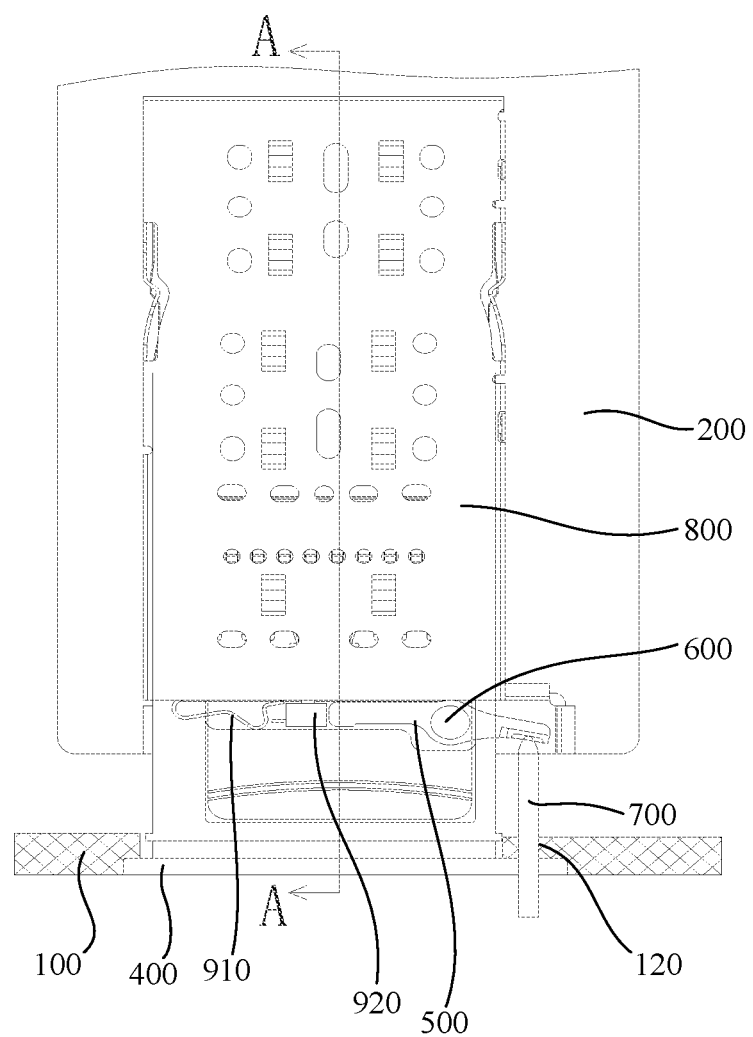
FIG. 2 is a schematic diagram of a partial structure of a mobile terminal when a tray is inserted according to an embodiment of this disclosure.
Figure 3:
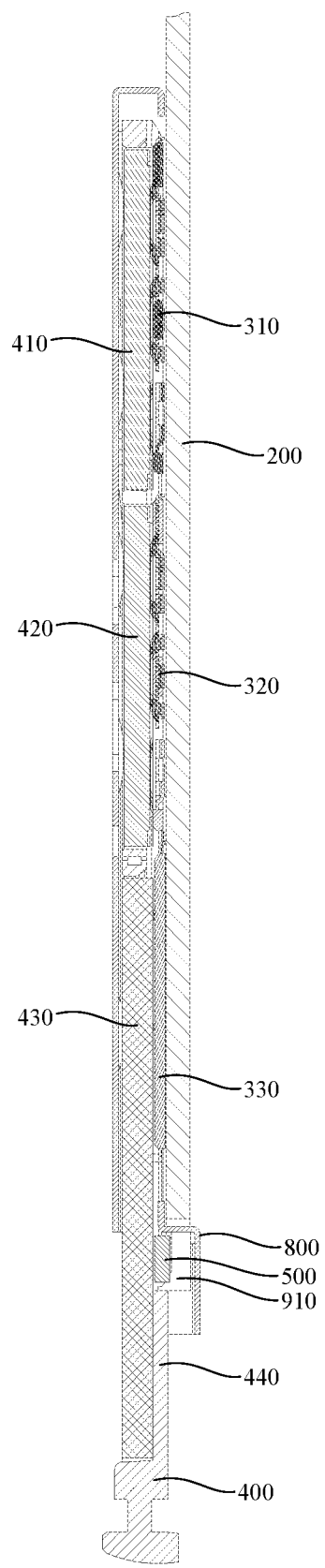
FIG. 3 is an A-A section view of FIG. 2.
Figure 4:
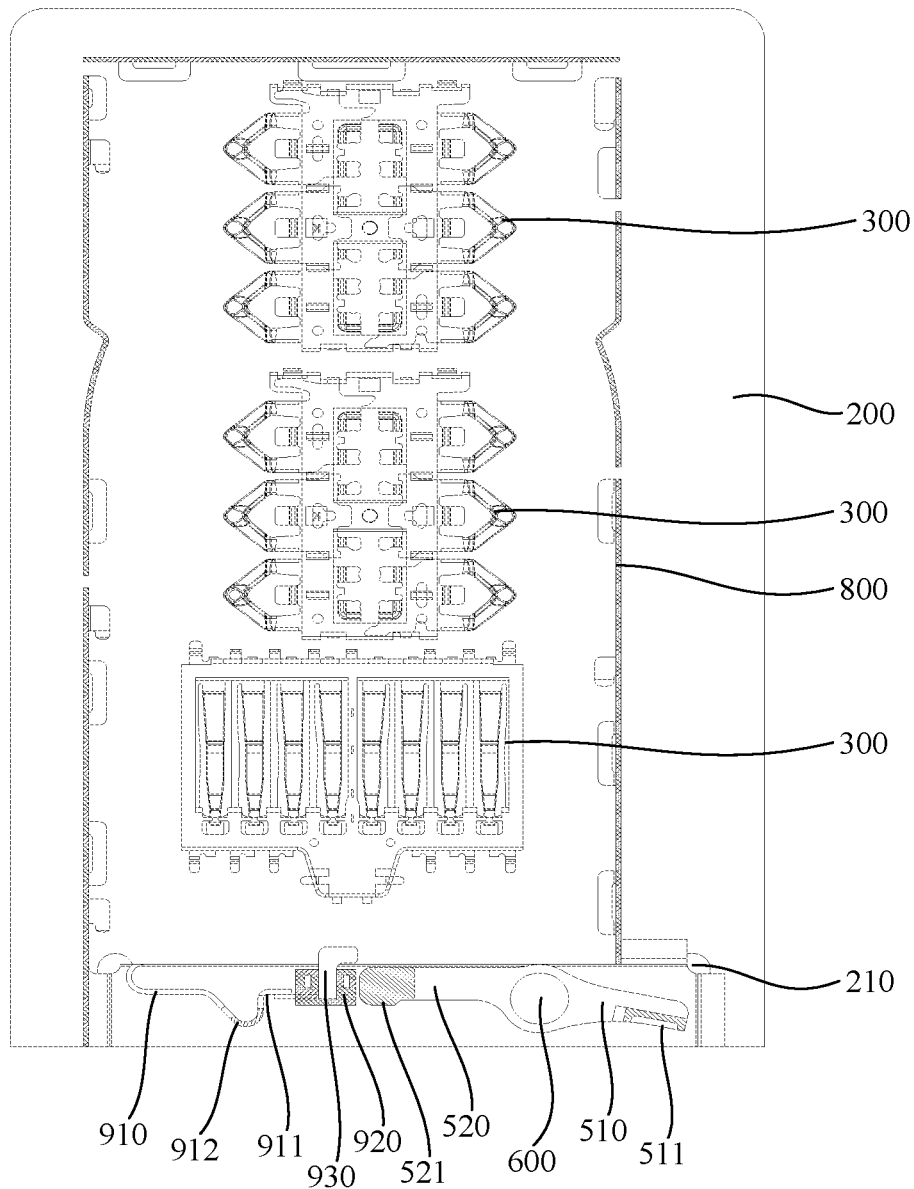
FIG. 4 is a schematic diagram of the partial structure in FIG. 1 when an elastic detection piece is in contact with a detection terminal.
Figure 5:
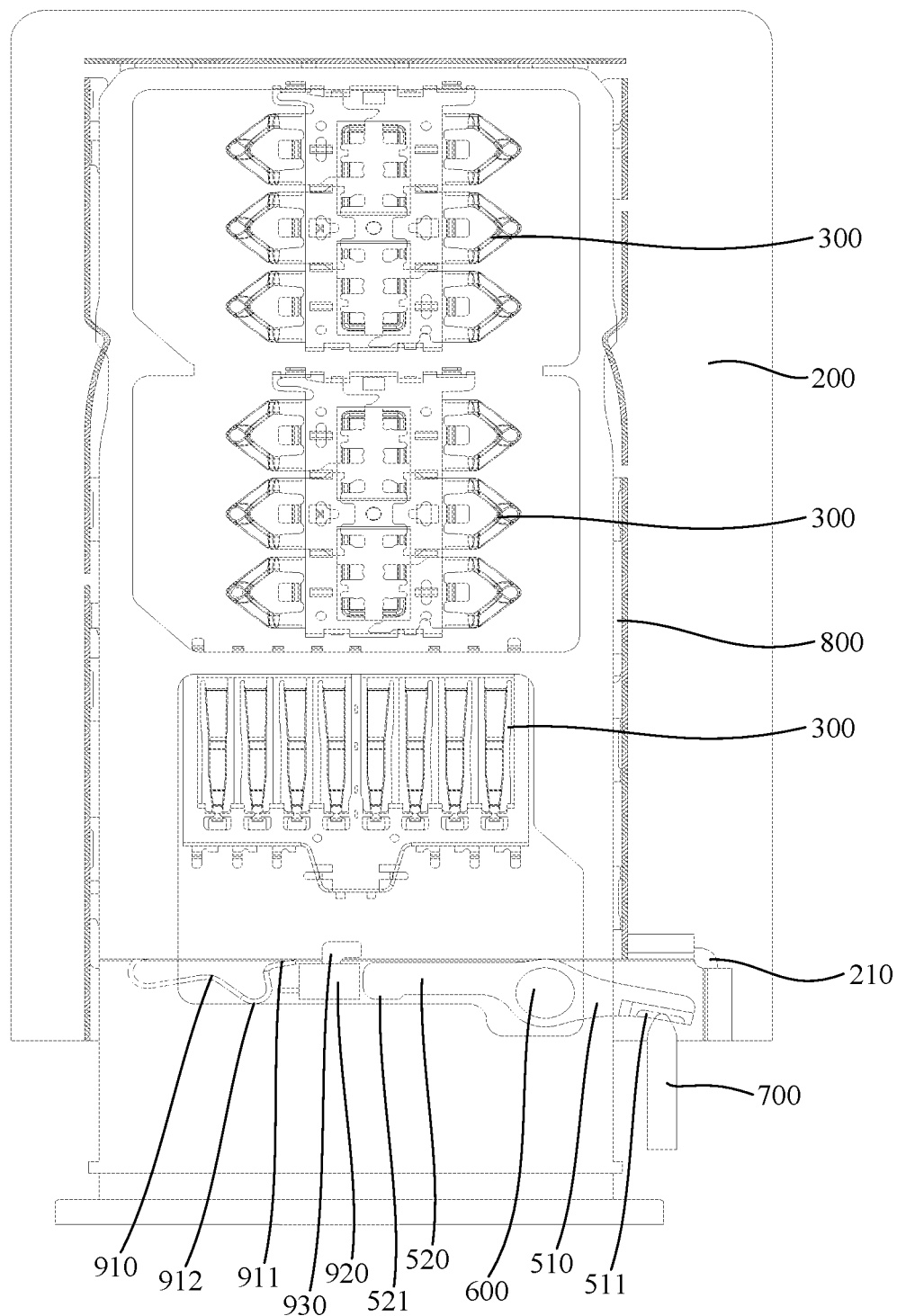
FIG. 5 is a schematic diagram of the partial structure in FIG. 1 when an elastic detection piece is not in contact with a detection terminal.

As shown in FIGS. 1 to 5, a mobile terminal according to an embodiment of this disclosure includes a housing 100, a circuit board 200, a card holder 300, a tray 400, a toggle piece 500, and a tray retention portion 800. The housing 100 is an exterior component of the mobile terminal, and a tray installation hole 110 is provided thereon. The tray installation hole 110 is used to install the tray 400. The circuit board 200 is disposed inside the housing 100, with electronic components disposed thereon to enable communication, storage, and other functions of the mobile terminal. The card holder 300 is disposed on the circuit board 200. The tray 400 is movably disposed in the tray installation hole 110, and movably mates with the tray retention portion 800. A SIM card or memory card installed on the tray 400 can correspondingly mate with the card holder 300 for electrical conduction. At least the tray 400 or the housing 100 is provided with an ejection hole. A user can insert an ejector pin 700 into the ejection hole to eject the tray 400. It should be noted that the ejector pin 700 herein may be an ejector pin that comes with the mobile terminal, or may be another pin-like structure that can be inserted into the ejection hole. In this embodiment of this disclosure, an ejection hole 120 may be provided only in the housing 100.

The tray retention portion 800 may be disposed inside the housing 100, facing toward the circuit board 200, and may mate with a top surface and a bottom surface of the tray 400 and a top surface of a card for positioning, so that a location of the tray 400 in the tray installation hole 110 meets a requirement, and in addition, a force can be applied to the card on the tray 400, thereby enabling the card to be in reliable contact with the card holder 300, and improving reliability of electrical conduction.

A main function of the toggle piece 500 is to eject the tray 400. The toggle piece may be rotatably disposed at the tray retention portion 800 through a rivet 600, and is located between the card holder 300 and the ejection hole. One end of the toggle piece 500 is an ejector pin action receiving end 510, and the other end of the toggle piece 500 is a tray ejection end 520. The ejector pin action receiving end 510 can interact with the ejector pin 700. The user can apply a force to the ejector pin action receiving end 510 through the ejector pin 700 to drive the toggle piece 500 to rotate. When a force is accepted by the ejector pin action receiving end 510, the tray ejection end 520 applies an ejection force to the tray 400. That is, after the toggle piece 500 is rotated, the tray ejection end 520 gradually approaches the tray 400, and finally presses against the tray 400 to apply the ejection force to the tray 400. The tray 400 is ejected from the tray installation hole 110 under the action of the ejection force, and then protrudes relative to the housing 100, to enable the user to take out the tray.

Certainly, when the user installs the tray 400, as the tray 400 is gradually inserted into the tray installation hole 110, the tray 400 comes into contact with the tray ejection end 520 and applies a force to the tray ejection end 520, so that the toggle piece 500 rotates in a reverse direction, and the tray 400 can be completely inserted into the tray installation hole 110.

It can be learned from the foregoing descriptions that for the mobile terminal according to this embodiment of this disclosure, the tray 400 can be ejected by simply using the toggle piece 500, eliminating use of a push rod in a mobile terminal in a related art, and saving space occupied by the push rod on the circuit board 200. In addition, the toggle piece 500 is located between the card holder 300 and the ejection hole (which may be specifically the ejection hole 120), and space occupied by the toggle piece 500 in this case is space not used by the mobile terminal in the related art. Therefore, the toggle piece 500 does not occupy space of the circuit board 200 near the end of the tray 400, that is, the toggle piece 500 does not occupy additional space on the circuit board 200. It can be learned that the circuit board 200 of the mobile terminal is not divided due to a mechanism used to eject and insert the tray 400, and therefore the circuit board has more effective space, and electronic component layout thereon is easier to implement. For example, the mobile terminal can more easily implement a full screen, so as to enhance market competitiveness of the mobile terminal.

In addition, the mobile terminal gets rid of the push rod, thereby reducing components of the mobile terminal, simplifying assembly of the mobile terminal, and reducing costs of the mobile terminal.

To facilitate ejection of the tray 400, an ejector pin action receiving slot 511 may be opened in the ejector pin action receiving end 510. The ejector pin action receiving slot 511 is opposite the ejection hole (which may be specifically the ejection hole 120). When the ejector pin 700 is inserted into the ejection hole, the ejector pin 700 is further inserted into the ejector pin action receiving slot 511. In a process of pushing the ejector pin 700 by the user, a side wall of the ejector pin action receiving slot 511 can limit a location of the ejector pin 700 and avoid problems such as jamming caused by slipping of the ejector pin 700 from the ejector pin action receiving end 510.

The ejector pin action receiving slot 511 may be larger than the ejection hole in size, so that the ejector pin 700 can be reliably inserted into the ejector pin action receiving slot 511, the ejector pin 700 can move in the ejector pin action receiving slot 511 in a moving process of the toggle piece 500, and problems such as jamming of the ejector pin 700 can be avoided. Specifically, in an axial direction of the ejection hole, a projection-plane contour line of the ejector pin action slot 511 surrounds a projection-plane contour line of the ejection hole, that is, the ejector pin action receiving slot 511 is larger than the ejection hole in size. In addition, the ejector pin action receiving slot 511 may be a circle, an ellipse, a triangle, a rectangle, or the like. This is not limited in this disclosure.

A surface of the tray ejection end 520 facing toward the ejection hole may be flat, but this structure results in a small action area between the tray ejection end 520 and the tray 400. Consequently, the tray ejection end 520 and the tray 400 are prone to scratches. For this reason, the tray ejection end 520 may be provided with an ejection protrusion 521. The ejection protrusion 521 protrudes to a side on which the ejection hole is located. In this case, a surface structure of the ejection protrusion 521 can be designed specifically, so that the tray ejection end 520 always maintains a large contact area with the tray 400 when the toggle piece 500 rotates as a whole, thereby preventing scratches. In addition, this structure can also appropriately reduce sizes of parts of the toggle piece 500 other than the tray ejection end 520, thereby making the toggle piece 500 easier to arrange.

The mobile terminal disclosed in this embodiment of this disclosure may also be provided with a structure for detecting whether the card on the tray 400 is loaded. This structure specifically includes an elastic detection piece 910 and a detection terminal 920 that are provided on the tray retention portion 800. Both of them are located between the card holder 300 and the ejection hole, that is, both the elastic detection piece 910 and the detection terminal 920 are arranged in close proximity to the toggle piece 500. The detection terminal 920 may be fastened by a terminal fastener 930. The terminal fastener 930 may be a plastic piece made of an insulation material. The elastic detection piece 910 has a free end 911 and a tray action receiving portion 912. The free end 911 can change its location after the elastic detection piece 910 is deformed by a force, and can return to the original location after the external force is removed. The tray action receiving portion 912 can be in contact with the tray 400, and then receives a force from the tray 400. Therefore, the tray 400 can apply a driving force to the tray action receiving portion 912 to separate the free end 911 from the detection terminal 920, and under the action of an elastic restoring force of the elastic detection piece 910, the free end 911 comes into contact with the detection terminal 920.

When the tray 400 is installed in the tray installation hole 110, the tray 400 applies a force to the tray action receiving portion 912 to separate the free end 911 from the detection terminal 920, thereby generating an open circuit signal. The open circuit signal may be transmitted to a hardware system of the mobile terminal. The hardware system performs card scanning and detection based on the signal, and enabling the card to enter a working state. When the tray 400 is ejected from the tray installation hole 110, the force received by the tray action receiving portion 912 disappears, and the free end 911 resets and comes into contact with the detection terminal 920, thereby generating a conduction signal. The conduction signal may also be transmitted to the hardware system, so that the hardware system knows that the card has been ejected at this time, and then generates corresponding reminder information.

The elastic detection piece 910 and the detection terminal 920 are both located between the card holder 300 and the ejection hole. Therefore, the space not used by the mobile terminal in the related art is once again used by the elastic detection piece 910 and the detection terminal 920. Therefore, the elastic detection piece 910 and the detection terminal 920 no longer occupy additional space on the circuit board 200, so that the effective space on the circuit board 200 is larger, and the electronic component layout on the circuit board 200 is more convenient.

To facilitate the tray 400 to apply a force to the elastic detection piece 910, the tray action receiving portion 912 may protrude in a direction leaving the card holder 300 relative to the free end 911. With this arrangement, the tray 400 can first come into contact with the tray action receiving portion 912, and therefore is not prone to interference by structures such as the detection terminal 920, thereby facilitating force application. Specifically, the tray action receiving portion 912 may protrude in a direction leaving the card holder 300 through a bending process.

If a height at which any one of the toggle piece 500, the elastic detection piece 910, and the detection terminal 920 locates after installation is higher than a height at which the card above the three locates, interference may occur. To resolve this problem, an avoidance notch 210 is opened on a side of the circuit board 200 facing toward the tray 400, and a part of the tray retention portion 800 used to install the toggle piece 500, the elastic detection piece 910, and the detection terminal 920 is located in the avoidance notch 210. After the avoidance notch 210 is provided, the heights at which the toggle piece 500, the elastic detection piece 910, and the detection terminal 920 locate are reduced, thereby preventing interference between the three and the card on the tray 400.

The tray installation hole 110 may be a bar-shaped hole. In an optional embodiment, the toggle piece 500, the elastic detection piece 910, and the detection terminal 920 are arranged in order along an extension direction of the tray installation hole 110. As such, the toggle piece 500, the elastic detection piece 910, and the detection terminal 920 may have a more compact arrangement, thus the space under the card is fully utilized.

To meet a need of a user to install multiple SIM cards or memory cards in one mobile terminal, multiple card holders 300 may be provided on the circuit board 200, and these card holders 300 may correspondingly mate with multiple cards of a same type, or may mate with cards of different types. In this case, the toggle piece 500 is located between a card holder 300 closest to the ejection hole and the ejection hole.

In a specific embodiment, multiple card holders 300 may be arranged, including a first SIM card holder 310 that mates with a first SIM card 410, a second SIM card holder 320 that mates with a second SIM card 420, and a memory card holder 330 that mates with a memory card 430. The cards corresponding to the first SIM card holder 310 and the second SIM card holder 320 may be SIM cards of different radio access technologies, or cards of a same radio access technology. The memory card holder 330 may correspond to a TF card (TransFLash), an SD card (Secure Digital Memory Card), or the like. Certainly, there may be more card holders 300. Three or more card holders 300 may alternatively be used to mate with SIM cards, and two or more card holders 300 may alternatively be used to mate with memory cards.

The first SIM card holder 310, the second SIM card holder 320, and the memory card holder 330 are arranged in order in a direction close to the ejection hole, with the memory card holder 330 closest to the ejection hole. The toggle piece 500 is located between the memory card holder 330 and the ejection hole. Further, the elastic detection piece 910 and the detection terminal 920 may alternatively be located between the memory card holder 330 and the ejection hole. That is, after the tray 400 is installed in place, the toggle piece 500, the elastic detection piece 910, and the detection terminal 920 are all located below the memory card.

With the above structure, the tray 400 has a memory card support portion 440. The memory card support portion 440 is used to apply a reset force to move the tray ejection end 520 toward the card holder 300, and the tray ejection end 520 is used to apply the ejection force to the memory card support portion 440. In other words, an existing structure of the tray 400 can be used to realize mating between the tray 400 and the toggle piece 500, with no need to specifically provide a corresponding structure on the tray 400. Therefore, this solution can simplify the structure of the tray 400.

Due to an assembly error and other reasons, the toggle piece 500 may also move along a thickness direction of the mobile terminal when it rotates, resulting in that the toggle piece 500 cannot be in reliable contact with the tray 400. To resolve this problem, a position limiting portion (not shown in the figure) may be provided on the tray retention portion 800. The position limiting portion faces toward the toggle piece 500 and mates with the toggle piece 500 for position limiting in a rotation axis direction of the toggle piece 500. Therefore, the position limiting portion can limit the movement of the toggle piece 500 along the thickness direction of the mobile terminal, and ensure that the toggle piece 500 and the tray 400 are in reliable contact.

The mobile terminal disclosed in the embodiments of this disclosure may be a smart phone, a tablet computer, an e-book reader, or a wearable device. Certainly, the mobile terminal may alternatively be other terminal devices. This is not limited in the embodiments of this disclosure.

The foregoing embodiments of this disclosure focus on differences between the embodiments. Different optimization elements in the embodiments can be combined to form a more optimal embodiment provided that they are not contradictory to each other. For brevity of the description, details are not described herein.

The foregoing descriptions are only embodiments of this disclosure, and are not used to limit this disclosure. For a person skilled in the art, this disclosure may have various changes and variations. Any modification, equivalent replacement, and improvement made without departing from the spirit and principle of this disclosure shall fall within the protection scope of the claims of this disclosure.

What is claimed is:

1. A mobile terminal, comprising:
   a housing, provided with a tray installation hole;
   a circuit board, disposed inside the housing;
   a tray retention portion, disposed inside the housing, wherein the tray retention portion faces toward the circuit board;
   a card holder, disposed on the circuit board;

a tray, movably disposed in the tray installation hole and movably mating with the tray retention portion, wherein at least the tray or the housing is provided with an ejection hole; and a toggle piece, rotatably disposed at the tray retention portion and located between the card holder and the ejection hole, wherein one end of the toggle piece is an ejector pin action receiving end, the other end of the toggle piece is a tray ejection end, and the tray ejection end is used to apply an ejection force to the tray after a force is applied to the ejector pin action receiving end.

2. The mobile terminal according to claim 1, wherein the ejector pin action receiving end is provided with an ejector pin action receiving slot, and the ejector pin action receiving slot is opposite the ejection hole.

3. The mobile terminal according to claim 2, wherein in an axial direction of the ejection hole, a projection-plane contour line of the ejector pin action receiving slot surrounds a projection-plane contour line of the ejection hole.

4. The mobile terminal according to claim 1, further comprising an elastic detection piece and a detection terminal disposed on the tray retention portion, wherein both the elastic detection piece and the detection terminal are located between the card holder and the ejection hole, the elastic detection piece has a free end and a tray action receiving portion, the tray is capable of applying a driving force to the tray action receiving portion to separate the free end from the detection terminal, and under the action of an elastic restoring force of the elastic detection piece, the free end is in contact with the detection terminal.

5. The mobile terminal according to claim 4, wherein the tray action receiving portion protrudes in a direction leaving the card holder with respect to the free end.

6. The mobile terminal according to claim 4, wherein a surface of the circuit board facing toward the tray is provided with an avoidance notch, and a part of the tray retention portion used to install the toggle piece, the elastic detection piece, and the detection terminal is located in the avoidance notch.

7. The mobile terminal according to claim 4, wherein the toggle piece, the detection terminal, and the elastic detection piece are arranged in order along an extension direction of the tray installation hole.

8. The mobile terminal according to claim 1, wherein multiple card holders are arranged, and the toggle piece is located between the ejection hole and a card holder closest to the ejection hole.

9. The mobile terminal according to claim 8, wherein the multiple card holders comprise a first subscriber identification module (SIM) card holder, a second SIM card holder, and a memory card holder, and the three are arranged in order in a direction close to the ejection hole, and the toggle piece is located between the memory card holder and the ejection hole.

10. The mobile terminal according to claim 9, wherein the tray has a memory card support portion, the memory card support portion is used to apply a reset force to move the tray ejection end toward the card holder, and the tray ejection end is used to apply the ejection force to the memory card support portion.

11. The mobile terminal according to claim 1, wherein the tray ejection end is provided with an ejection protrusion, and the ejection protrusion protrudes to a side on which the ejection hole is located.

12. The mobile terminal according to claim 1, wherein the tray retention portion is provided with a position limiting portion, and the position limiting portion faces toward the toggle piece and mates with the toggle piece for position limiting in a rotation axis direction of the toggle piece.

* * * * *